United States Patent [19]
Tanaka

[11] Patent Number: 5,982,310
[45] Date of Patent: *Nov. 9, 1999

[54] DIGITAL SIGNAL PROCESSING APPARATUS

[75] Inventor: Yasuyuki Tanaka, Tokyo, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/879,604

[22] Filed: Jun. 20, 1997

[30] Foreign Application Priority Data

Jun. 27, 1996 [JP] Japan .................................. 8-167263

[51] Int. Cl.$^6$ ...................................................... H03M 1/06
[52] U.S. Cl. ........................................... 341/118; 341/139
[58] Field of Search ..................................... 341/118, 120, 341/139

[56] References Cited

U.S. PATENT DOCUMENTS

| | | |
|---|---|---|
| 4,143,361 | 3/1979 | Tammes et al. ........................ 341/118 |
| 4,380,005 | 4/1983 | Debord et al. ........................... 341/118 |
| 4,590,458 | 5/1986 | Evans et al. ............................. 341/118 |
| 4,771,267 | 9/1988 | Russell, Jr. et al. ..................... 341/118 |
| 4,989,005 | 1/1991 | Wakiyama et al. ...................... 341/166 |
| 4,996,529 | 2/1991 | Connell .................................. 341/118 |
| 5,329,281 | 7/1994 | Baumgartner et al. ............. 341/118 X |
| 5,424,738 | 6/1995 | Barroue et al. .......................... 341/118 |
| 5,635,934 | 6/1997 | Brown ..................................... 341/118 |

*Primary Examiner*—Michael Tokar
*Assistant Examiner*—Patrick Wamsley
*Attorney, Agent, or Firm*—Fitzpatrick, Cella, Harper & Scinto

[57] ABSTRACT

A signal processing apparatus includes a device for inputting an analog signal which includes digital information, a converter for converting the analog signal to a digital form, an adder for combining one output of the converter with another output of the converter, a detector for detecting an off-set of the analog signal based on an output of the adder, and a compensator for compensating for the off-set of the analog signal based on an output of the detector.

42 Claims, 7 Drawing Sheets

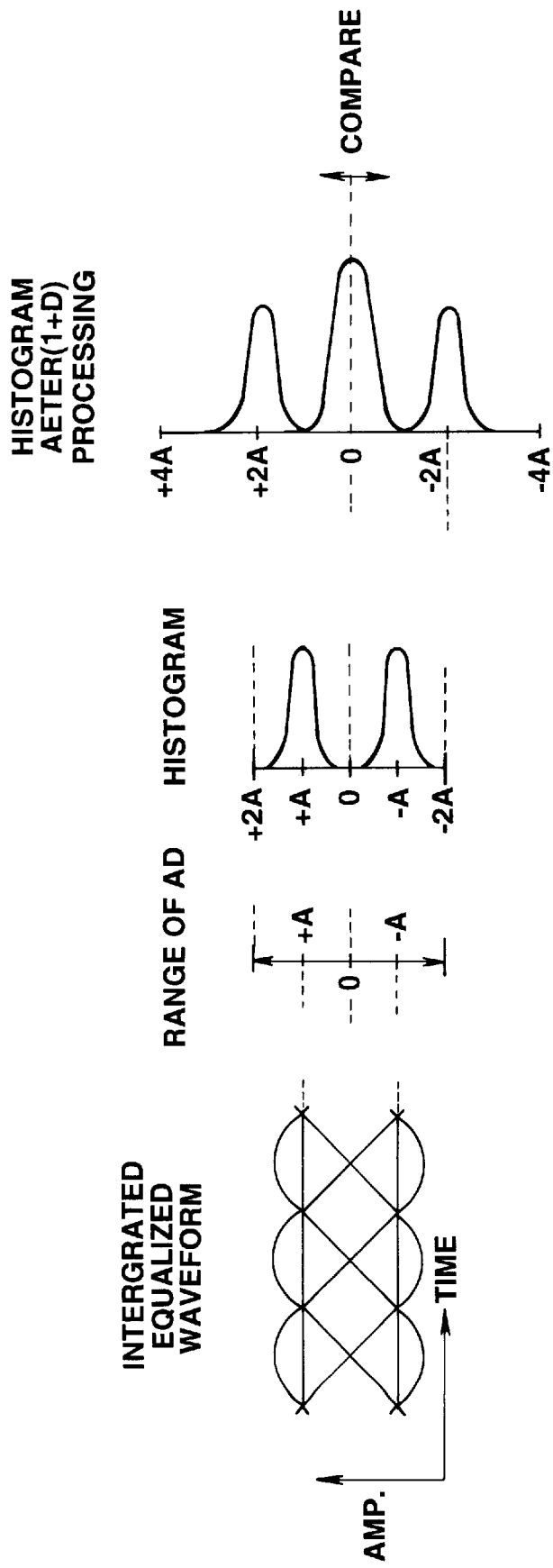

DIGITAL SIGNAL PROCESSING APPARATUS

BACKGROUND OF THE INVENTION

1. Field of the Invention

This invention relates to a digital signal processing apparatus and more particularly to an apparatus for receiving analog signals which represent digital information and which processes such analog signals with high precision.

2. Description of the Related Art

In the field of magnetic recording and reproduction, a magnetic recording medium, in which a digital recording format suitable for consumer electronics, has been developed and is being manufactured.

In order to reproduce a digital signal which is based on this digital recording format, it is necessary, by means of rotary heads, to trace oblique tracks formed on a magnetic recording tape.

In the reproducing system of this type of apparatus, a signal to be reproduced is in analog form but contains digital information. Accordingly, the reproduced analog signal must be restored to digital form. In order to do this, it is necessary to provide: automatic gain control (AGC) to control the gain of the reproduced signal; automatic phase control (APC) to generate clock signals which are synchronized with the reproduced signal; and automatic tracking finding (ATF) for controlling tracking based on a reproduced pilot signal.

Since the digital information which is recovered in such apparatus will be processed in a digital manner, the above mentioned AGC, APC and ATF should also be obtainable in a digital manner in order to keep the system simple.

The prior art includes several techniques for obtaining the foregoing AGC, APC and ATF. In these techniques, a reproduced analog signal is transformed to a digital form. Also, phase detection for APC and gain detection for AGC, etc., are carried out or executed by processing of the digital information.

However, time or temperature changes may produce direct current offset components, which can become added to the output of the AGC and introduce errors in the detection process. In such a case, it becomes impossible to execute the above mentioned AGC, APC and ATF exactly.

Also, if the AGC circuit were to be made independent of the APC and the ATF circuits, the overall size of the circuits would be too large.

Accordingly, it is desired to provide small size circuits which are capable of correctly executing AGC, APC and ATF and which can be incorporated in Large Scale Integrated (LSI) circuits.

SUMMARY OF THE INVENTION

This invention is directed to overcome the above described problems; and it is an object of the present invention to provide a digital signal processing apparatus which overcomes the above problems.

Another object of the invention is provide an apparatus which can execute each signal processing step with high precision and stability.

Still another object of the invention is to provide an apparatus in which a predetermined frequency component can be extracted exactly by a small scale circuit.

According to one aspect of the invention, there is provided a novel digital signal processing apparatus which comprises means for inputting an analog signal which includes digital information, means for converting the analog signal to a digital form, means for adding one output of the converting means to another output of the converting means, means for detecting an off-set of the analog signal based on an output of the adding means, and means for compensating for the off-set based on the output of the detecting means.

According to another aspect of the invention, there is provided a novel digital signal processing apparatus which comprises means for inputting an analog signal which includes digital information, means for converting the analog signal to a digital form, means for adding one output of the converting means to another output of the converting means, and means for detecting a predetermined frequency component of the analog signal based on an output of the adding means.

According to a further aspect of the present invention, there is provided a novel method of processing digital signals which comprises the steps of inputting an analog signal which includes digital information, converting the analog signal to a digital form, adding different results of the converting step, detecting an off-set of the analog signal based on the result of the adding step; and compensating for the off-set of the analog signal based on a result of the detection.

According to a still further aspect of the invention, there is provided a novel digital signal processing method which comprises the step of inputting an analog signal which includes digital information, converting the analog signal to a digital form, adding one result of the converting step to another result of the converting step, and detecting a predetermined frequency component of the analog signal based on a result of the adding step.

BRIEF DESCRIPTION OF THE DRAWINGS

FIGS. 4(a), 4(b), 4(c) and 4(d) are, respectively, a waveform, a range diagram and histograms showing the range of gain of an analog input signal and changed digital data, as well as a frequency which occurs in this range;

DETAILED DESCRIPTION OF THE PREFERRED EMBODIMENTS

The first embodiment of this invention will be described with reference to FIGS. 1–6.

Figure 1:
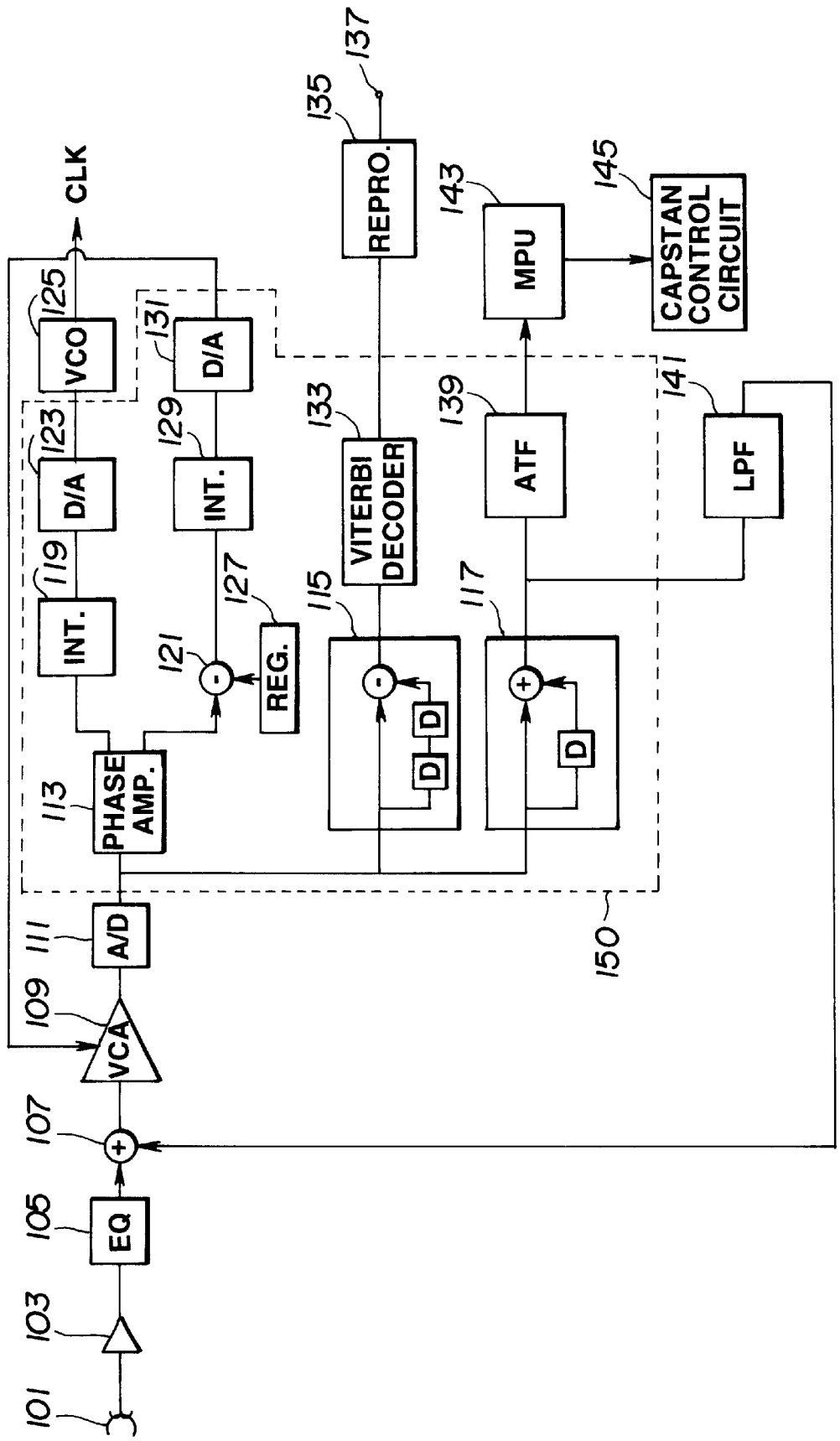
FIG. 1 is a block diagram showing an embodiment of a digital processing apparatus according to the present invention.

FIG. 1 shows the construction of a data processing apparatus which comprises part of the reproducing system of a digital Video Cassette Recorder (VCR).

In the construction of FIG. 1, a signal which is reproduced by a rotary pickup head 101, is amplified by an amplifier 103 and fed into an integration equalizer 105. The integration equalizer 105 emphasizes the high frequency components of the signals from the rotary head, such high frequency components having been reduced by the magnetic recording and reproducing system. The integration equalizer 105 also emphasizes the low frequency components which have been reduced by the differential characteristics of the rotary head. The equalized signal is supplied to an analog adder 107 which shifts any direct current component or offset of the signal.

The analog adder 107, which comprises an operational amplifier, removes any direct current offset from the incoming signal in the following manner. The signal, from which the direct current offset is to be removed, is supplied to a gain control amplifier 109. This signal also represents binary eye-pattern data. The gain control amplifier 109 adjusts the gain of the signal so that it will be in the optimum range for conversion in an analog to digital converter 111.

The analog to digital converter 111 receives the analog signal from the gain control amplifier 109 and converts the received analog signal to a digital signal comprising a plurality of bits. The digital signal is then fed to a phase/gain detector 113, a (1−2D) process circuit 115 and a (1+D) process circuit 117.

The phase/gain detector 113 detects the phase and gain of the signal received from the converter 111. The detected phase information is supplied to the integrator circuit 119 and the detected gain information is supplied to a subtracter 121.

The construction of the phase/gain detector 113 will be described with reference to FIG. 2.

Figure 2:
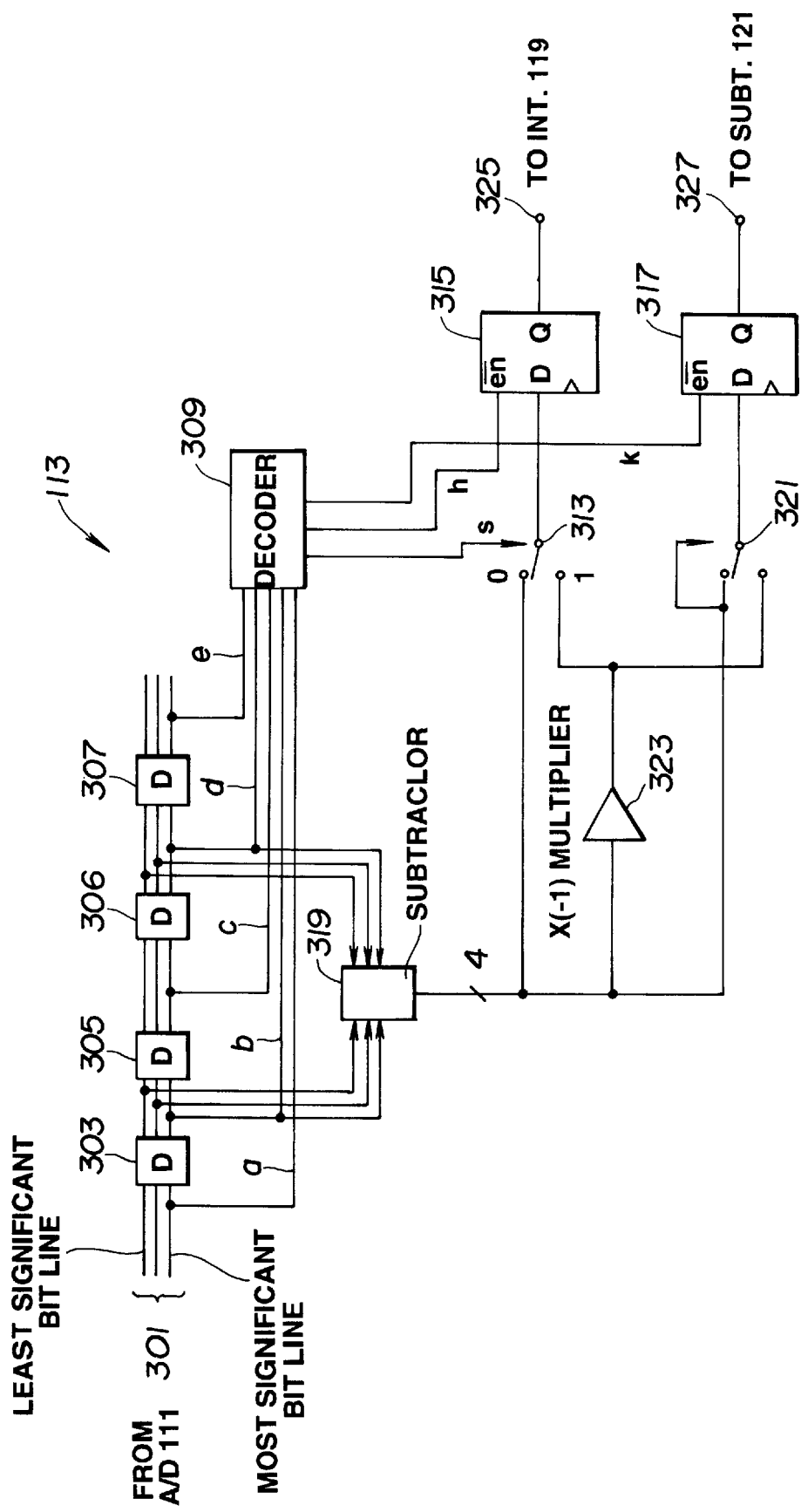
FIG. 2 is a block diagram showing, in more detail, certain components of the embodiment of FIG. 1.

In the arrangement shown in FIG. 2, the integration equalized data from the analog to digital converter 111 (FIG. 1) is supplied at an input terminal 301 and is delayed in each of a series of registers 303, 304, 305, 306 and 307 for one sampling term. Hereinafter, the most significant bit (MSB) of the output of each register is denoted respectively as a, b, c, d and e.

The most significant bits a, b, c, d and e are supplied to a decoder 309 and are processed according to a logic format. The decoder 309 supplies the processed signals as pulses s, h and k which are applied, respectively, to the operating terminal of a switch 313, and to the enable terminals $\overline{en}$ of clock-enabled registers 315 and 317.

The decoder 309 processes the most significant bits (MSB) of the signals which pass through the registers 303, 305, 306 and 307 (namely the signals a, b, c, d and e), according to the following algorithms:

$$s = c$$
$$h = (b \oplus d) + \overline{a} \cdot \overline{c} \cdot \overline{e} + a \cdot c \cdot e$$
$$k = (\overline{(b \oplus d)})$$

In the foregoing, the symbol ⊕ refers to an "exclusive OR" function, which means that if either b or d is equal to "1", the result of (b⊕d) is equal to "1"; but if both b and d are equal to "0", or both are equal to "1", the result of (b⊕d) will be "0". Also, in the foregoing, an overstrike above any letter or combination means that the value of the letter or combination is the inverse of what that letter or combination actually is. Thus, when the value of a equals "1", the value $\overline{a}$ equals "0".

There is a time difference of two clock pulses (equal to two sampling terms) between the outputs b and d of the registers 303 and 306. These outputs b and d are supplied to a subtracter 319 which produces a difference signal. The output of the subtracter 319 is supplied to one input terminal of each of the switches 313 and 321 as well as to the input of an x(−1) multiplier 323. The x(−1) multiplier 323 inverts the difference (i.e., negative or positive) between the pulses b and d and supplies this difference to one of two input terminals of each of the switches 313 and 321, respectively.

If the data c from the register 305 is "0", the decoder circuit 309 produces a signal s which operates the switch 313 so that the bits from the subtracter 319 are supplied to the input of a register 315. On the other hand, if the data c from the register 305 is "1", the signal s from the decoder circuit 309 will cause the switch 313 to direct the x(−1) output of the multiplier 323 to the input of the register 315.

The signals supplied to the register 315 are input data. The register 315 receives the plurality of bits data and is updated continuously while a signal h, fed from the decoder 309, is "0". The register 315 holds the last received plurality of bits data when the signal h from the decoder 309 becomes "1". The output of the register 315 is supplied to an output terminal 325 as phase information.

The switch 321 selectively outputs the plurality of bits output from the subtracter 319, or the converted output of the subtracter 319, according to the sign (positive or negative) of the subtracter output. That is, the switch 321 outputs an absolute value of the output of the subtracter 319 and supplies it to an input terminal D of the register 317. The register 317 latches (i.e., samples) the plurality of bits data from the switch 321 if the signal k from the decoder 309 being fed to the enable terminal $\overline{en}$ of the register 317 is "0". On the other hand, the register 315 holds the plurality of bits data, if the signal k is "1". The output of the register 317 is supplied to an output terminal 327 as gain information.

Next, the phase and gain information will be described. The input data, which has binary eye-pattern characteristics, is integrated and shaped into a continuous wave form by a roll off filter in the integration equalizer 105 (FIG. 1). The formed wave is then converted by the A/D (analog to digital) converter 111 and supplied to the terminal 301 of the phase/gain detector 113 (FIG. 2).

It is assumed that the output of the register 305 in FIG. 2 (i.e., signal c) is at the center of a sampling time period. In such a case, the signal h from the decoder 309 would be "0" if the data b and d are the same and the data c is not the same as the data a and e. When the data h from the decoder 309 is "0" it causes the data in the register 315 to be renewed.

Figure 3A:
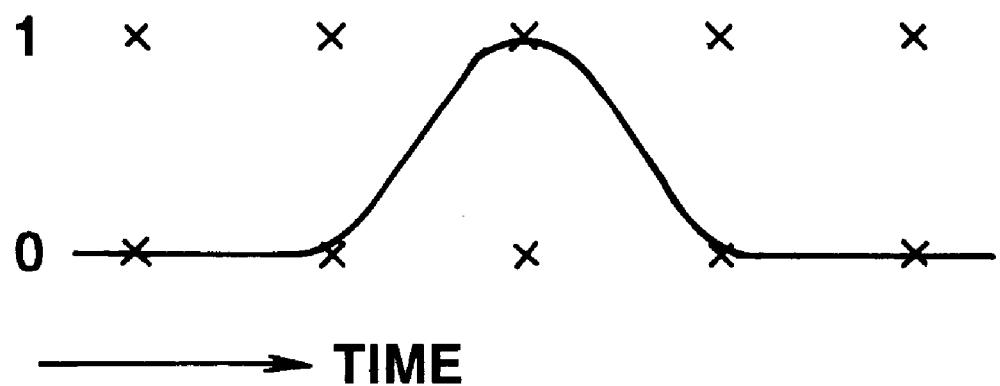
FIGS. 3(a) and 3(b) are waveforms for explaining the operation of phase and gain detection carried out in the embodiment of FIG. 1.
Figure 3B:
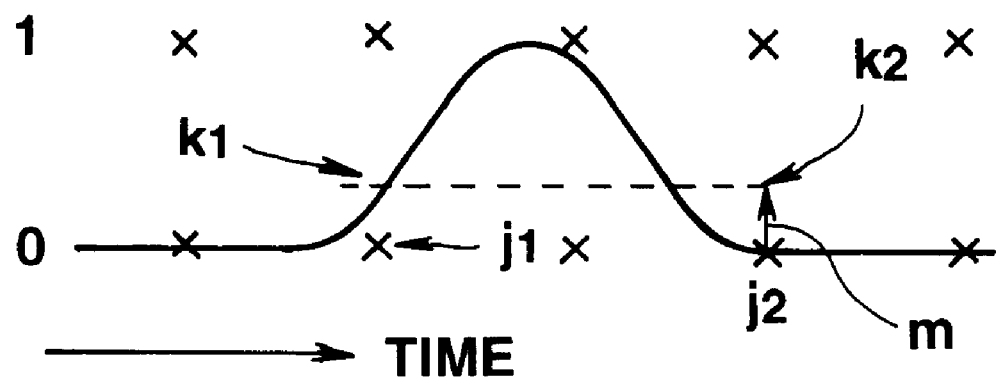

For example, assuming that five groups of data, of which the most significant bits (MSB) are "0", "0", "1", "0" and "0", as shown in FIG. 3, are input. In FIG. 3, the points x represent the sampling timing of the A/D converter 111. If the relationship between the sampling timing and the input wave-form is optimum, in which each sampling point at the center of a sampling time period corresponds to the peak of the waveform, the difference between each data bit and the corresponding portion of the waveform must be about "0" as shown in FIG. 3(a). On the other hand, if the relationship between the sampling timing and the input waveform is not optimum, a difference m will occur between successive items of data k1 and k2 which are sampled at the sampling timing j1 and j2, respectively, as shown in FIG. 3(b).

If the phase of the sampling timing is delayed with respect to the input data and the data between k1 and k2 is positive (+), the difference m=(k1−k2) will be positive, as shown in FIG. 3(b). If the phase of the sampling timing is advanced against the input data and the data between k1 and k2 is positive (+), the difference m=(k1−k2) will be negative (−). The relationship between the polarity of the difference and the phase of each data bit will be changed based on the data c (the data is "0" or "1"). Therefore, the switch 313 switches the polarity of the difference obtained by the subtracter 319 based on the data c. Consequently, the phase relationship regarding the above phase will be able to be detected on the same basis for each group composed of five sequential data which cause the data "h" to be "0", for example, ("0", "0", "0", "0", "0"); "0"); ("0", "0", "0", "0", "1"); ("1", "0", "0", "0""0"); and ("1", "1", "1", "1", "1"). The above mentioned difference m is supplied to the integrator 119 (FIG. 1) from the terminal 325 of the phase/gain detector 113 (FIG. 2) as phase information.

Regarding the gain information, it is assumed that when the output c of the register 305 in FIG. 2 is at the center of a sampling time period, the signal a is "0". In such a case, if the data b and d are not the same and the data a is "0", the data a renews the data in the register 317.

If the data b and d are not the same, there must be a zero cross point before and after the center of the time period; and the difference between the output of the register 303 and the output of the register 306 is in proportion to the gain of the input data.

The above mentioned difference m is supplied to a subtracter 121 (FIG. 1) via the terminal 327 of the phase/gain detector 113 (FIG. 2) as gain information. The timing for latching the gain information and the timing for latching the phase information are not overlapped, so that each of these items of information can be respectively outputted from the phase/gain detector 113.

Referring again to FIG. 1, the phase information which is supplied to the integrator 119 is averaged; and the averaged output is transformed to analog form by a digital to analog (D/A) converter 123. The output from the D/A converter 123 is supplied to a Voltage Controllable Oscillator (VCO) 125 as a control signal. The output frequency of the VCO 125 changes based on the input voltage. The output of the VCO 125 is used as a clock signal for the A/D converter 111 as well as for several other circuits.

The above mentioned construction consists of a Phase Locked Loop (PLL) which controls the VCO so that the output of the VCO is maintained at a predetermined frequency.

The gain information from the phase/gain detector 113 is supplied to the subtracter 121 which also receives a target gain from a register 127. The subtracter 121 produces a difference between the target gain and the present gain by comparing them with each other. The difference produced by the subtracter 121 represents a gain error. This gain error is supplied from the subtracter 121 to the integrator 129, where it is averaged. The averaged gain error is supplied to a Digital to Analog (D/A) converter 131. The D/A converter 131 supplies an analog control signal to the Gain Control Amplifier (GCA) 109 as a control signal.

The above described construction serves as an automatic gain control which controls the voltage control amplifier 109 so that the gain of the reproduced signal is maintained constant at the optimum value for a changeable range of the A/D converter 111.

The digital data supplied to the (1−2D) processing circuit 115 is subtracted from the data corresponding to the previous two clock periods. The resulting data is fed into a viterbi decoder 133 as a three value waveform in precise response class 2. The viterbi decoder 133 decodes the data by means of the likelihood of a three value waveform.

The output of the viterbi decoder 133 is supplied to an image processing circuit 135 as reproduced digital data. The image processing circuit 135 restores the original image from the reproduced data by using well known techniques; and outputs the reproduced image signal via an output terminal 137.

The data supplied to the (1+D) processing circuit 117 is added to the data which corresponds to the previous clock signal; and the processing circuit 117 produces the three values data. The Most Significant Bit (MSB) of the three values data is supplied to an Automatic Tracking Finder (ATF) detector 139 and to a Low Pass Filter (LPF) 141. As mentioned above, in this embodiment, the data fed to the Automatic Tracking Finder (ATF) detector 139 and to the Low Pass Filter (LPF) 141 is a single data bit and not a plurality of bits. Accordingly, the size of the circuits involved can be minimized.

And especially, the tracking control and control for direct current off-set are controlled at high precision by using the Most Significant Bit (MSB) of the data. For example, assuming that the clock rate is Fb and the frequency for tracking is 6O/Fb, this corresponds to sampling with about 6 bits, which is precise enough for tracking.

In FIG. 1, the portion enclosed by a dotted line 150 represents a digital signal processor constructed on one Large Scale Integrated (LSI) circuit chip. The output of the digital signal processor is outputted via an output terminal of the LSI circuit chip and is fed to an analog Low Pass Filter (LPF) 141 as a predetermined level signal. It will be understood that in some cases the Automatic Tracking Finder (ATF) detector 139 may be separated from the chip 150 on which the other elements of the phase/gain detector 113 are formed.

FIG. 4(a) shows an eye-pattern corresponding to the analog signal from the voltage controlled amplifier 109 (FIG. 1) which is fed to the A/D converter 111. FIG. 4(b) shows the gain range of the digital signal converted from the analog signal. FIGS. 4(c) and 4(d) are histograms for the signals in the range. It is assumed that the converted data is distributed in the vicinity of +A and −A as shown in FIG. 4(c). The output data of the (1+D) processing circuit 117 (FIG. 1) is distributed in the vicinity of 0, +2 A and −2 A as shown in FIG. 4(d).

Using the Most Significant Bit (MSB) of the three values data is equivalent to comparing the three values data with zero. The signal which is formed according to the three values data has a region in the vicinity of a zero distribution as shown in FIG. 4(d).

The Most Significant Bit (MSB) is significantly affected by the direct current off-set. Specifically, if the three values data has an area of distribution which is off-set from zero, tracking precision would be decreased, since the energy of the pilot signal in the MSB would be reduced.

Figure 5A:
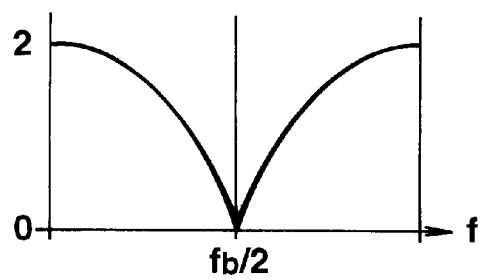
FIG. 5(a) is a plot of the frequency characteristic of a processing circuit in the embodiment of FIG. 1.
Figure 5C:
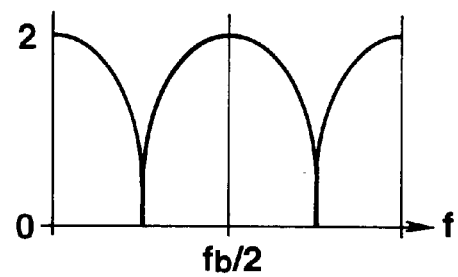
FIG. 5(c) is a plot of the frequency characteristic of a processing circuit which may be used instead of that shown in FIG. 5(b)
Figure 5B:
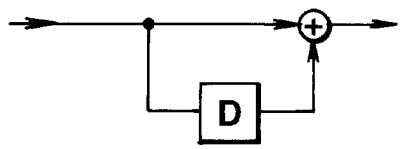
FIG. 5(b) is a block diagram of the processing circuit which the frequency characteristic of FIG. 5(a) represents.
Figure 5D:
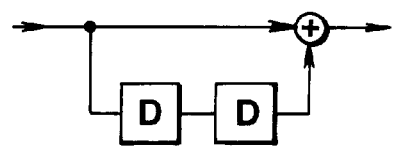
FIG. 5(d) is a block diagram of the processing circuit referred to in FIG. 5(c)

FIG. 5(a) shows the frequency characteristic of the output of the (1+D) processing circuit 117 (FIG. 5(b)). As shown in FIG. 5(a), the low frequency component, including direct current, passes through the (1+D) processing circuit 117, so that the predetermined frequency signal, which is low enough for tracking, also passes through the (1+D) processing circuit 117.

The Automatic Tracking Finder (ATF) detector 139 (FIG. 1) deals with the one bit digital signal and detects the ATF tone signal. The ATF tone signal is supplied to the Micro Processing Unit (MPU) 143. The MPU generates a tracking control signal according to the ATF tone signal; and the tracking control signal is supplied to a capstan control circuit 145. The capstan control circuit 145 controls the rotating speed of the capstan so that the pickup heads follow their respective tracks with high precision.

The Automatic Tracking Finder (ATF) tone detector 139 will now be described with reference to FIG. 6(a).

This embodiment uses a well known tracking control which includes two kinds of pilot signals f1 and f2, such as are used in digital Video Tape Recording (VTR). In the format for digital VTR, the pilot signals f1 and f2 are imposed on the digital signal and are recorded on respective tracks. In this format, while the pickup head is reproducing on the track in which the pilot signals are not recorded, the pilot signals f1 and f2 in the reproduced signal are detected and compared with each other; and the result of the comparing is used as a tracking control signal for the tracking control.

Figure 6B:
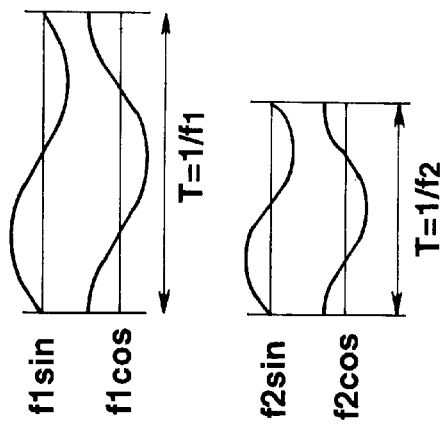
FIG. 6(b) is a set of waveforms used in the adder of FIG. 6(a)
Figure 6A:
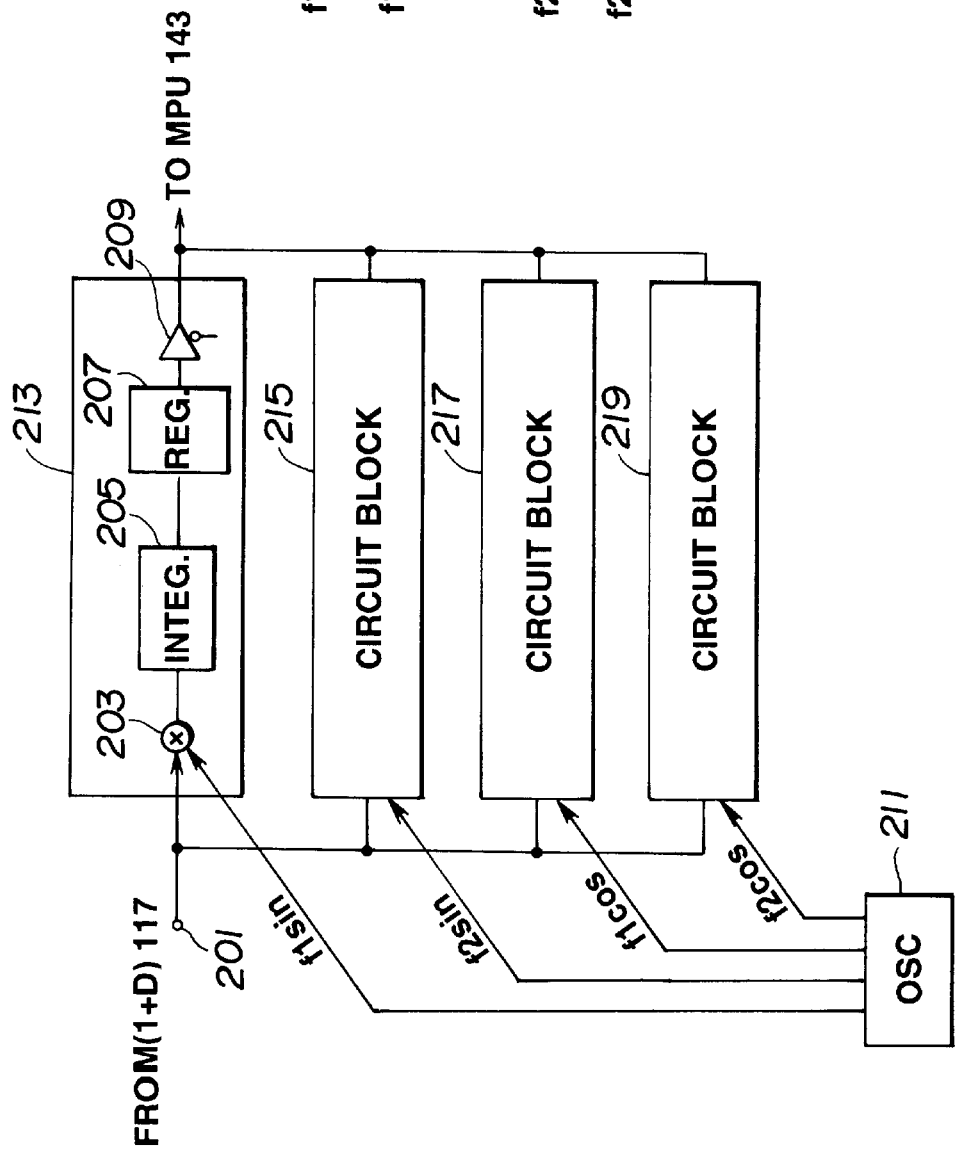
FIG. 6(a) is a block diagram showing an adder which is used in the embodiment shown in FIG. 1.

As shown in FIG. 6(a), the one bit data (MSB) from the (1+D) processing circuit 117 (FIG. 1) is applied at the terminal 201 and is supplied to each of the circuit blocks 213, 215, 217 and 219. In FIG. 6(a), the blocks 213, 215, 217 and 219 are each of the same construction, and operate in dependency on the inputted clock signals. A tracking tone oscillator 211 generates four kinds of pilot signals as shown in FIG. 6(b). The tone oscillator 211 supplies a sine curve signal f1 to the circuit block 213, a cosine curve signal f1 to the circuit block 215, a sine curve signal f2 to the circuit block 217, and a cosine curve signal f2 to the circuit block 219, respectively.

In the circuit block 213, the one bit data is supplied to a multiplier 203 where it is multiplied with the sine curve signal f1. The resulting product is supplied to an integrator 205 and is accumulated for a predetermined term. Thereafter, the output of the integrator 205 is sampled and held by a register 207. A buffer 209 is connected to the MPU 143 (FIG. 1). The MPU 143 releases the buffer 209, so as to enable an output; and then it reads the value being held in the buffer 209.

The circuit blocks 213, 215, 217 and 219 hold the sine curve signal f1, the cosine curve signal f1, the sine curve signal f2 and the cosine curve signal f2, respectively. The MPU 143 detects the f1 component by executing a Root Mean Square (RMS) operation for the outputs of the circuit blocks 213 and 215; and the MPU detects the f2 component by executing an RMS operation for outputs of the circuit blocks 217 and 219. In the above, the RMS operation means that each of the two inputted values is multiplied by itself and the results are added to each other. The MPU 143 (FIG. 1) detects which track is traced by the pickup head by comparing the f1 signal with the f2 signal; and the output is supplied into the capstan control circuit 145 as a tracking control signal.

Since the multiplicand of the multiplier 203 is one bit, the multiplier 203 only selects an operation x(1) or an operation x(−1). Therefore, the multiplier 203 can be constructed with a simple logic circuit if the output of the oscillator 211 is two value data (one bit) or three value data (two bits). In addition, if the integrator 205 is constructed as an up-down counter, the size of the circuit will be substantially reduced.

Figure 7A:
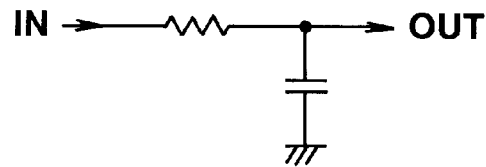
FIGS. 7(a)–7(c) are circuit diagrams of alternate forms of a low pass filter which may be used in the embodiment of FIG. 1.
Figure 7B:
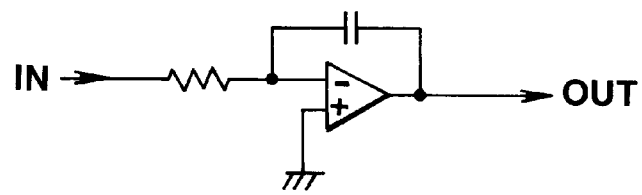
Figure 7C:
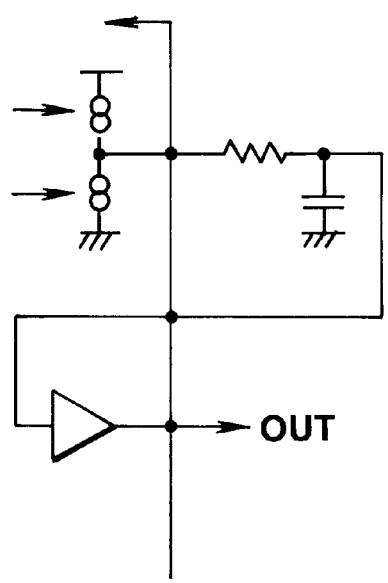

Referring again to FIG. 1, the Most Significant Bit (MSB) output of the (1+D) processing circuit 117 is outputted via a terminal of the digital processing LSI circuit chip 150. Then, the gain is controlled to a predetermined gain and is leveled by the Low Pass Filter (LPF) 141. The LPF 141 may be constructed as a low pass capacitor-resistor circuit, as shown FIG. 7(a), or by an integrator with an operational amplifier, as shown FIG. 7(b), or alternatively, by a charge pump circuit, as shown FIG. 7(c).

The output of the Low Pass Filter (LPF) 141 is supplied to the analog adder 109 to remove a direct current off-set in the reproduced signal. As mentioned above, if the input of the A/D converter 111 has a direct current off-set, an area of distribution of the three values signal, which should be distributed around zero, will be cut off. Therefore, the probability that the MSB is 1 or 0, which should be 50%, will be off as well, and will affect the process by the above mentioned AGC, APC and ATF.

In this embodiment, the above mentioned off-set is compensated for by the Low Pass Filter (LPF) 141 and the analog adder 107. As a result, the phase detection and the gain detection will be steadied (or stabilized). Also, the precision of the tracking control will be improved.

In the above described embodiment, the direct current off-set is detected by adding adjoining sampling data in the (1+D) processing circuit 117 (FIG. 5(c) at low speed). However, the direct current off-set may be detected by adding the next adjoining sampling data in the (1+2D) processing circuit (FIG. 5(d)) at low speed.

In the above described embodiment, the Low Pass Filter (LPF) 141 is constructed as an analog circuit. However, the LPF 141 may be constructed by digital circuits with an up-down counter, and may be integrated into the digital processing LSI chip 150 shown in FIG. 1.

As mentioned above, according to the present invention, a small size circuit can detect the off-set and can compensate for the off-set as digital data, since the output of the A/D converter is added to another output of the A/D converter, and the off-set based on the MSB of the output of the adder is detected.

The above described digital signal processing apparatus can detect the gain of the analog signal, the sampling phase of the A/D converter, and a predetermined frequency component of the analog signal with high precision.

Furthermore, with the above described digital signal processing apparatus, a small size circuit can detect the predetermined frequency component of the analog signal as digital data, since an adder is provided for adding an output of the A/D converter with another output of the same A/D converter and since there is provided a detector for detecting the off-set based on the MSB of the output of the adder.

What is claimed is:

1. A digital signal processing apparatus comprising:
   (a) means for inputting an analog signal which includes digital information;
   (b) converting means for converting said analog signal to a digital form;
   (c) adding means for combining one output of said converting means with another output of said converting means;
   (d) detecting means for detecting an off-set of said analog signal based on an output of said adding means; and
   (e) compensating means for compensating for said off-set of said analog signal based on an output of said detecting means.

2. A digital signal processing apparatus according to claim 1, wherein said another output of said converting means is based on an adjacent sample of said output of said converting means.

3. An apparatus according to claim 2, wherein said detecting means detects the off-set of the analog signal based on the most significant bit of an output of said adding means, the output of said adding means representing an addition of adjacent samples.

4. A digital signal processing apparatus according to claim 1, wherein said detecting means includes integrating means for integrating said output of said adding means.

5. A digital signal processing apparatus according to claim 4, wherein said integrating means includes an analog low pass filter.

6. A digital signal processing apparatus according to claim 1, further comprising gain detecting means for detecting the gain of said analog signal.

7. A digital signed processing apparatus according to claim 6, further comprising gain controlling means for controlling said gain of said analog signal based on an output of said detecting means.

8. A digital signal processing apparatus according to claim 6, wherein said detecting means comprises:
   (a) operation means for performing operations on a plurality of said outputs of said converting means; and
   (b) holding means for holding an output of said operation means based on a pattern of said output of said converting means.

9. A digital signal processing apparatus according to claim 1, further comprising phase detecting means for detecting a sampling phase used in said converting means.

10. A digital processing apparatus according to claim 9, further comprising phase control means for controlling a clock phase of said converting means based on an output of said phase detecting means.

11. A digital signal processing apparatus according to claim 9, wherein said phase detecting means comprises:
   (a) operation means for performing operations on a plurality of said outputs from said converting means; and
   (b) holding means for holding an output of said operation means based on a pattern of said output of said converting means.

12. A digital signal processing apparatus according to claim 1, further comprising frequency detecting means for detecting predetermined frequency components of said analog signal by using an output of said adding means.

13. A digital signal processing apparatus according to claim 12, further comprising:
   (a) means for reproducing said analog signal from a recording medium; and
   (b) means for controlling tracking by using a pilot signal of said predetermined frequency component.

14. An apparatus according to claim 12, wherein said frequency detecting means detects the predetermined frequency components based on the most significant bit of an output of said adding means, the output of said adding means representing an addition of adjacent samples.

15. A digital signal processing apparatus comprising:
   (a) input means for inputting an analog signal including digital information;
   (b) converting means for converting said analog signal to a digital form;
   (c) adding means for adding one output of said converting means and another output of said converting means; and
   (d) detecting means for detecting a predetermined frequency component of said analog signal based on an output of said adding means.

16. A digital signal processing apparatus according to claim 15, wherein said another output of said converting means is based on an adjoining sample of said output of said converting means.

17. An apparatus according to claim 16, wherein said detecting means detects the predetermined frequency components based on the most significant bit of an output of said adding means, the output of said adding means representing an addition of adjacent samples.

18. A digital signal processing apparatus according to claim 15, further comprising:
   (a) means for reproducing said analog signal from a recording medium; and
   (b) means for controlling tracking by using a pilot signal of said predetermined frequency component.

19. A digital signal processing apparatus according to claim 18, wherein said recording medium is a tape recording medium, and wherein said predetermined frequency component detecting means detects two kinds of pilot signals from both side tracks along a track which is traced by said reproducing means.

20. A digital signal processing apparatus according to claim 19, wherein said tracking controls means compares said two kinds of pilot signals.

21. A digital signal processing apparatus according to claim 15, further comprising:
   (a) means for detecting an off-set of said analog signal based on the most significant bit of an output of said adding means; and
   (b) means for compensating for said off-set of said analog signal based on an output of said detecting means.

22. A method of processing digital signals comprising the steps of:
   (a) inputting an analog signal which includes digital information;
   (b) converting said analog signal to a digital form;
   (c) adding different results of said converting step;
   (d) detecting an off-set of said analog signal based on the result of said adding step; and
   (e) compensating for said off-set of said analog signal based on a result of said detection.

23. A method according to claim 22, wherein said different results are successive results of said output of said converting step.

24. A method according to claim 23, wherein said detecting step comprises detecting the off-set of the analog signal based on the most significant bit of the result of said adding step, the result of said adding step representing an addition of successive results of said converting step.

25. A method according to claim 22, wherein said detecting step includes a step of integrating the result of said adding step.

26. A method according to claim 25, wherein said step of integrating includes passing the result of said adding step through an analog low pass filter.

27. A method according to claim 22, further comprising the step of detecting the gain of said analog signal.

28. A method according to claim 27, further comprising the step of controlling said gain of said analog signal based on an output of said step of detecting the gain.

29. A method according to claim 27, wherein said step of detecting the gain includes:
   (a) performing operations on a plurality of results of said step of converting; and
   (b) holding an output of said step of performing operations based on a pattern of said step of converting.

30. A method according to claim 22, further comprising the step of detecting a sampling phase used in said step of converting.

31. A method according to claim 30, further comprising the step of controlling a clock phase of said converting step based on a result of said phase detecting step.

32. A method according to claim 30, wherein said phase detecting step comprises:

(a) the step of performing operations on a plurality of results of said converting step; and (b) the step of holding a result of said step of performing operations based on a pattern of results of said converting step.

33. A method according to claim 22, further comprising the step of detecting predetermined frequency components of said analog signal by using a result of said adding step.

34. A digital signal processing apparatus according to claim 33, further comprising:

(a) the step of reproducing said analog signal from a recording medium; and (b) the step of controlling tracking by using a pilot signal of said predetermined frequency component.

35. A method according to claim 33, wherein the predetermined frequency components are detected based on the most significant bit of the result of said adding step, the result of said adding step representing an addition of successive results of said converting step.

36. A digital signal processing method comprising:

(a) the step of inputting an analog signal including digital information;

(b) converting said analog signal to a digital form;

(c) adding one result of said converting step and another result of said converting step; and (d) detecting a predetermined frequency component of said analog signal based on a result of said adding step.

37. A method according to claim 36, wherein said another result of said converting step is based on an adjoining sample of said result of said converting step.

38. A method according to claim 37, wherein the predetermined frequency components are detected based on the most significant bit of the result of said adding step, the result of said adding step representing an addition of adjacent samples obtained by said converting step.

39. A method according to claim 36, further comprising:

(a) the step of reproducing said analog signal from a recording medium; and (b) the step of controlling tracking by using a pilot signal of said predetermined frequency component.

40. A method according to claim 39, wherein said recording medium is a tape recording medium, and wherein said step of detecting a predetermined frequency component involves the detection of two kinds of pilot signals from both side tracks along a track which is traced by a reproducing device.

41. A method according to claim 40, wherein said tracking controls means compares said two kinds of pilot signals.

42. A method according to claim 41, further comprising:

(a) the step of detecting an off-set of said analog signal based on the most significant bit of a result of said adding step; and (b) the step of compensating for said off-set of said analog signal based on a result of said off-set detecting step.

* * * * *

UNITED STATES PATENT AND TRADEMARK OFFICE
CERTIFICATE OF CORRECTION

PATENT NO. : 5,982,310

DATED : November 9, 1999

INVENTOR(S): YASUYUKI TANAKA

Page 1 of 2

It is certified that error appears in the above-identified patent and that said Letters Patent is hereby corrected as shown below:

IN THE DRAWINGS:

SHEET 2:
Figure 2, "SUBTRACHLOR" should read --SUBTRACTER--.

SHEET 4:
Figure 4(a), "INTERGRATED" should read --INTEGRATED--.

IN THE DISCLOSURE:

COLUMN 1:
Line 12, "in which" should read --having--; and
Line 58, "is" should read --is to--.

COLUMN 4:
Line 2, "a" should read --"a"--.

UNITED STATES PATENT AND TRADEMARK OFFICE
CERTIFICATE OF CORRECTION

PATENT NO. : 5,982,310

DATED : November 9, 1999

INVENTOR(S): YASUYUKI TANAKA

Page 2 of 2

It is certified that error appears in the above-identified patent and that said Letters Patent is hereby corrected as shown below:

COLUMN 5:
Line 13, ""O");" should be deleted.

COLUMN 7:
Line 64, "shown" should read --shown in--;
Line 66, "shown" should read --shown in--; and
Line 67, "shown" should read --shown in--.

COLUMN 9:
Line 7, "signed" should read --signal--.

Signed and Sealed this

Twenty-sixth Day of September, 2000

Q. TODD DICKINSON

*Attest:*

*Attesting Officer*    *Director of Patents and Trademarks*